(12) United States Patent
Bergstedt et al.

(10) Patent No.: US 6,424,318 B1
(45) Date of Patent: Jul. 23, 2002

(54) METHOD AND ARRANGEMENT PERTAINING TO MICROWAVE LENSES

(75) Inventors: Leif Bergstedt, Sjömarken; Herbert Zirath, Mölndal, both of (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/556,871

(22) Filed: Apr. 21, 2000

(30) Foreign Application Priority Data

Apr. 23, 1999 (SE) .............................................. 9901467

(51) Int. Cl.⁷ .............................................. H01Q 15/08
(52) U.S. Cl. ...................... 343/911 R; 343/753; 29/600
(58) Field of Search ........................ 343/911 R, 911 L, 343/753; 29/600; H01Q 15/08

(56) References Cited

U.S. PATENT DOCUMENTS

| | | | | |
|---|---|---|---|---|
| 3,781,896 A | * | 12/1973 | Toulis ......................... | 343/754 |
| 5,185,613 A | * | 2/1993 | Whatmore et al. ......... | 343/909 |
| 5,264,859 A | * | 11/1993 | Lee et al. .................... | 343/754 |
| 5,313,365 A | | 5/1994 | Pennisi et al. | |
| 5,583,376 A | | 12/1996 | Sickler et al. .............. | 257/702 |
| 5,680,260 A | | 10/1997 | Farcella et al. ............. | 359/819 |
| 5,866,953 A | | 2/1999 | Akram et al. | |
| 5,952,984 A | * | 9/1999 | Kuramoto et al. ....... | 343/911 R |
| 6,233,098 B1 | * | 5/2001 | Plesko ......................... | 359/666 |

FOREIGN PATENT DOCUMENTS

| | | |
|---|---|---|
| DE | 40 16 311 A1 | 11/1991 |
| EP | 0 632 524 A1 | 1/1995 |
| EP | 0 903 807 A2 | 3/1999 |
| GB | 2 029 114 A | 3/1980 |

OTHER PUBLICATIONS

Sanjay Raman, et al., "A W–Band Dielectric–Lens–Based Integrated Monopulse Radar Receiver", IEEE Transactions on Microwave Theory and Techniques, vol. 46, No. 12, Dec. 1998, pp. 2308–2316.

Alfred Richard Perkons, et al., "TM Surface–Wave Power Combining by a Planar Active–Lens Amplifier", IEEE Transactions on Microwave Theory and Techniques, vol. 46, No. 6, Jun. 1998, pp. 775–783.

* cited by examiner

*Primary Examiner*—Hoanganh Le
(74) *Attorney, Agent, or Firm*—Burns, Doane, Swecker & Mathis, L.L.P.

(57) ABSTRACT

The present invention addresses the problem of simplifying the provision of microwave lenses in particular, but not exclusively, when microwave lenses are disposed in the close proximity of antenna elements (3) in devices (1; 1.1) for transmitting and/or receiving microwave radiation. According to the invention, a microwave lens is formed from a droplet (11; 11.1) of material that refract microwave radiation. The droplet (11; 11.1) assumes a predetermined shape in a liquid state, said shape depending chiefly on external limitations, the volume of material used and the properties of the material. The droplet (11; 11.1) is then allowed to solidify while retaining said assumed shape. The invention relates to devices and methods relating to this simplified provision of microwave lenses.

25 Claims, 2 Drawing Sheets

METHOD AND ARRANGEMENT PERTAINING TO MICROWAVE LENSES

FIELD OF INVENTION

The present invention relates to the field of methods and arrangements that pertain to microwave lenses.

DESCRIPTION OF THE BACKGROUND ART

There is sometimes the need to transmit or receive microwave radiation in technical applications. Radar and microwave communication are examples of such technical applications.

Different forms of antenna elements are used to transmit and/or receive microwave radiation. Monopoles, dipoles, horns, resonant slots, microstrip patches or aperture-coupled microstrip antennas are examples of different antenna elements used in this respect.

It is sometimes desirable to be able to influence significantly the microwave radiation that shall be transmitted and/or received by the antenna elements. When receiving, it is sometimes desirable to collect together microwave radiation to the antenna elements. When transmitting, it is sometimes desirable to spread or concentrate the microwave radiation generated by the antenna elements. In order to achieve this type of influence on microwave radiation, it is normal to use microwave lenses that are disposed in the close proximity of the antenna elements such as to influence the microwave radiation in the manner intended by refraction of the microwave radiation. The microwave lenses are produced from a dielectric, such as alumina. An example of a more complicated application of microwave lenses is given by S. Raman et al, "A W-Band Dielectric-Lens-Based Integrated Monopulse Radar Receiver", IEEE TRANSACTIONS ON MICROWAVE THEORY AND TECHNIQUES, Vol. 46, No. 12, December 1988, where microwave lenses are used to eliminate particular electromagnetic oscillating modes along a surface of a substrate in a receiver of a monopulse radar for the millimetre wave range.

One drawback with microwave lenses, however, is that the arrangement of such lenses is relatively complicated and expensive. It is first necessary to shape the lenses, which is effected by abrasion or moulding. The lenses are then fitted in holders adjacent the antenna elements. The lenses must be positioned very precisely in the holders, because there must be no air gap of any appreciable size between the lenses and the antenna elements, and because the lenses must not come into contact with the antenna elements and therewith possibly damaged.

SUMMARY OF THE INVENTION

The present invention mainly addresses the problem of simplifying the arrangement of microwave lenses in particular but not exclusively, when microwave lenses are arranged in the close proximity of antenna elements in devices for transmitting and/or receiving microwave radiation.

In brief, the above defined problem is solved in the following manner. The microwave lens is arranged in the form of a material droplet that refracts microwave radiation. In a liquid state, the droplet assumes a predetermined shape which is determined mainly by outer limitations or boundaries, the amount of material in the droplet, and the properties of the material. The droplet is then allowed to solidify while retaining its assumed shape. The microwave lens can thus be produced very easily, because the lens (droplet) need not be shaped by abrasion, moulding or equivalent processes.

A main object of the present invention is thus to simplify the manufacture of microwave lenses, and the invention includes both methods and devices that are related to this simplified manufacturing process.

More specifically, the aforesaid problem is solved by exemplifying embodiments of the invention.

According to one embodiment of the invention, one or more microwave lenses are provided in the aforesaid manner in connection with antenna elements in the manufacture of a device for transmitting and/or receiving microwave radiation, wherein the invention also relates to such a device.

According to another exemplifying embodiment of the invention, the aforesaid method of arranging microwave lenses is applied in a method manufacturing microwave lenses, wherein the invention also includes microwave lenses obtained in this way.

The invention will now be described in more detail with reference to preferred embodiments thereof and also with reference to the accompanying drawings.

DETAILED DESCRIPTION OF PREFERRED EMBODIMENTS

Figure 1:
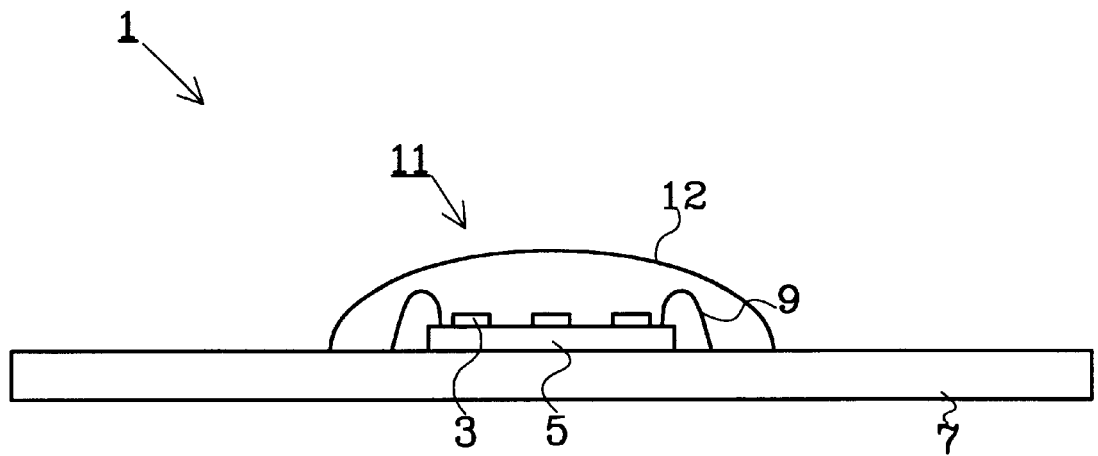
FIG. 1 is a plan view illustrating an example of an inventive device for transmitting or receiving microwave radiation.

FIG. 1 is a plan view of one embodiment of an inventive device 1 for transmitting and/or receiving microwave energy.

The device 1 shown in FIG. 1 includes a number of antenna elements 3 disposed on a carrier element in the form of a microwave chip 5. Alternatively, the antenna element 3 may be disposed on some other type of carrier element, for instance on a ceramic substrate or on a printed circuit board (PCB).

The microwave chip 5 is mounted on a circuit board 7 and is connected to said board by means of bond wires 9. Alternatively, the microwave chip 5 may be connected to the circuit board 7 in some other way, for instance by means of galvanically conductive vias.

A microwave lens in the form of a solidified droplet 11 of a material that refracts microwave radiation is disposed in connection with the antenna elements 3. The droplet 11 has been disposed over the antenna elements 3 and the microwave chip 5 in a liquid state and has therewith assumed a predetermined shape and subsequently solidified. In the FIG. 1 embodiment, the droplet 11 has been caused to encapsulate the antenna elements 3 and the microwave chip 5 and therewith also provides mechanical protection for the antenna elements 3 and the microwave chip 5.

The droplet 11 refracts the microwave radiation that is generated and/or received by the antenna elements 3. The influence that the droplet 11 has on the microwave radiation will depend on the shape of the droplet 11 and also on the refractive property of the material from which the droplet 11 is made. The shape of the droplet 11 is determined by the amount of material used in this respect, possible external limitations or boundaries, and the physical properties of the material, primarily the density and surface tension of said material. In one preferred embodiment of the invention, the material used is chiefly a polymeric material, for instance a thermosetting resin. The skilled person is thus able to produce a droplet 11 that has a predetermined influence on microwave radiation, for instance by choosing an appropriate amount of material and/or by adapting the physical properties of the material used. The physical properties of the material are governed by adding different additives thereto. The surface tension of the droplet 11 is adapted with the aid of some form of thinner that will lower the surface tension of the droplet for instance, for example a thixotropic agent, wherewith the curvature of the droplet delimiting surface 12 decreases (and therewith also the focal distance of the microwave lens comprised of the droplet). The refractive properties of the material can also be adapted through the medium of additives. The simplest method of adapting the refractive property of the material is by changing the dielectric constant of the material, for instance by adding to the material barium titanate ($BaSrTiO_3$) or magnesium titanate ($MgTiO_3$). In one preferred embodiment of the invention, the relative dielectric constant of the material is comparatively large, since a large dielectric constant corresponds to a high refractive capacity (high refractive index). The relative dielectric constant is preferably greater than 10. It is particularly beneficial when the relative dielectric constant of the material lies in the range [30, 40].

Figure 2:
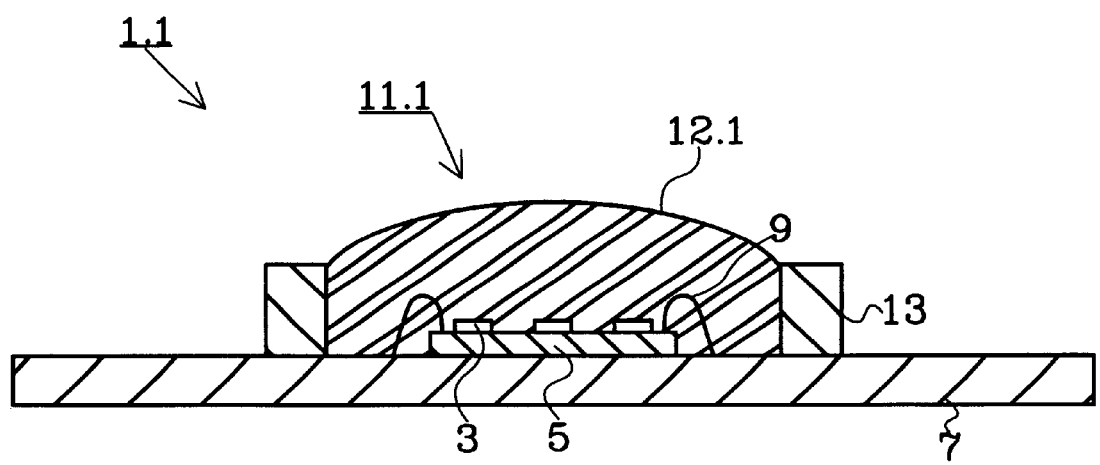
FIG. 2 is a cross-sectional view of a further exemplifying embodiment of an inventive device for transmitting or receiving microwave radiation.

FIG. 2 is a cross-sectional view of a further exemplifying embodiment of an inventive device 1.1 for transmitting and/or receiving microwave radiation. The construction of the device 1.1 in FIG. 2 corresponds more or less with the construction of the device 1 shown in FIG. 1 and for the sake of simplicity those features of the device 1.1 shown in FIG. 2 that find precise correspondence with the features of the device 1 shown in FIG. 1 have been given the same reference numerals as those used in FIG. 1.

The device 1.1 shown in FIG. 2 includes a frame 13 mounted on the circuit board 7. The frame 13 is comprised of a tubular element of circular cross-section surrounding the microwave chip 5 on which the antenna elements 3 are mounted. The frame 13 may alternatively have some other cross-sectional shape, for instance a rectangular shape. A microwave lens in the form of a solidified droplet 11.1 of material that will refract microwave radiation (similarly to the droplet 11 in FIG. 1) is disposed in the close proximity of the antenna elements 3. The droplet 11.1 in FIG. 2 is disposed in the frame 13 and the shape of the droplet 11.1 is therewith influenced by the external limitations defined by the frame 13. Variation of the amount of material in the droplet 11.1 will result in variation in the distance between the curved delimiting surface 12.1 of the droplet 11.1 and the antenna elements 3 without influencing crowning of the delimiting surface 12.1 to any appreciable extent. This enables the focus of the microwave lens, which is comprised of the droplet 11.1 to a greater degree (compared with the device 1 in FIG. 1), to be varied independently of the focal distance. Curvature of the delimiting surface of the droplet 11.1 is varied in the aforedescribed manner, by changing the physical properties of the material. Alternatively, curvature of the droplet can be varied by changing the size of the frame 13.

Alternatively, the devices 1 and 1.1 shown in FIGS. 1 and 2 may include further microwave lenses, for instance in the form of solidified droplets similar to the droplets 11 and 11.1 in FIGS. 1 and 2, or microwave lenses that have been formed in some other way, for instance by abrasion or moulding. The microwave radiation is therewith refracted by a system of microwave lenses that refine the options of influencing microwave radiation.

Figure 3:
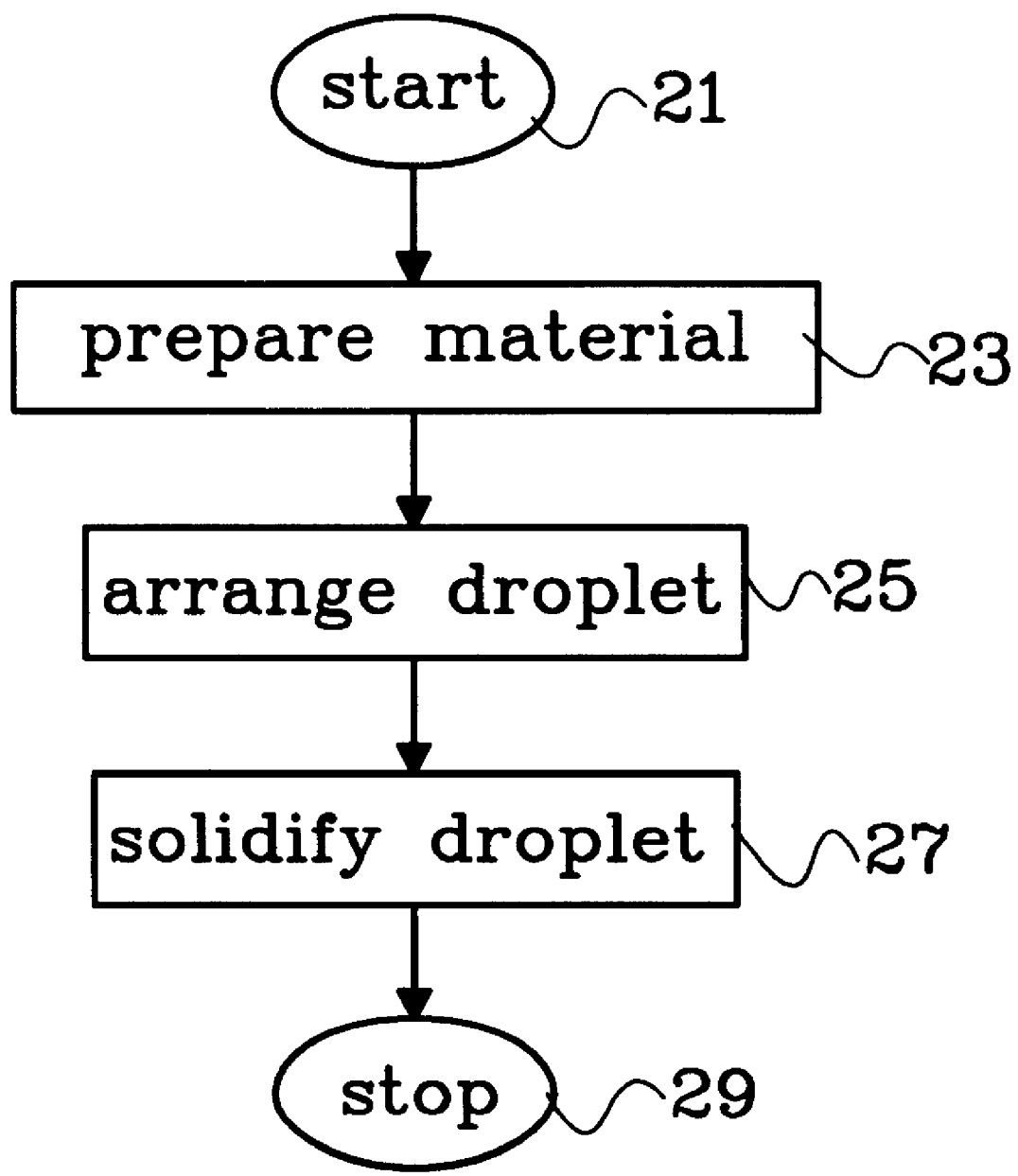
FIG. 3 is a flowchart which illustrates one example of a method of producing the device shown in FIG. 1.

FIG. 3 is a flowchart that describes an exemplifying embodiment of an inventive method of manufacturing the device 1.

After a start 21, the illustrated method comprises a first step 23 in which the material from which the droplet shall be produced is prepared. This preparation includes the introduction of additives that influence the properties of the material, for instance barium titanate and thixotropic substance, as mentioned above.

The method illustrated in FIG. 3 continues with a second step 25, in which a predetermined volume of the prepared material is placed in a liquid state above the microwave chip 5 and the antenna elements 3. In one preferred embodiment appropriate dispensing equipment is used to this end, for instance system 3700 of Camalot manufacture. Dispensers are constructed to deliver precise volumes of liquid substances, for instance in gluing and similar processes. However, the invention is not restricted to the use of dispensing equipment when arranging the droplet 11. When the liquid droplet 11 has been positioned over the antenna elements 3 and the microwave chip 5, the droplet will assume a state of equilibrium that is determined by the amount of material in the droplet 11, the physical properties of the droplet, etc., as described above. There is no danger of the droplet damaging the antenna elements 3, since the droplet 11 is positioned over the antenna elements 3 in a liquid state. Neither is there any air gap between the droplet 11 and said antenna elements 3.

The method illustrated in FIG. 3 continues with a third step 27 in which the droplet 11 is allowed to solidify. In one preferred embodiment, the droplet is solidified by a curing process, e.g. a UV curing process (curing with ultraviolet light) or by a hot-setting process. The droplet 11 may, alternatively, be allowed to solidify in some other way. As indicated by the stop box 29, the method disclosed in FIG. 3 is terminated upon completion of the third step 27.

The method shown in FIG. 3 may, of course, be applied, mutatis mutandis, in the manufacture of the device 1.1 in FIG. 2.

The method disclosed in FIG. 3 may also be used, mutatis mutandis, in the manufacture of microwave lenses in the form of droplets without said droplets necessarily being arranged adjacent antenna elements in manufacture. The invention includes such a method of producing microwave lenses and also to microwave lenses produced in accordance with the method.

What is claimed is:

1. A method of manufacturing a device for transmitting or receiving microwave radiation, the method comprising the steps of:

arranging at least one microwave lens in the close proximity of at least one antenna element for the microwave range; and producing at least one of the at least one microwave lens in the form of a droplet of material that refracts microwave radiation, wherein the droplet in a liquid state assumes a predetermined shape, whereafter the droplet is allowed to solidify while retaining the assumed shape.

2. The method according to claim 1, further comprising the step of arranging the droplet such that at least one of the at least one antenna element will be encapsulated by the droplet.

3. The method according to claim 1, wherein the droplet material is a polymeric material.

4. The method according to claim 3, wherein the droplet material includes thermosetting resin.

5. The method according to claim 1, further comprising the step of supplying the droplet material with an additive that influences the shape taken by the liquid droplet.

6. The method according to claim 5, further comprising the step of supplying the droplet material with an additive that influences the surface tension of the droplet.

7. The method according to claim 6, wherein the additive that influences the surface tension of the droplet includes a thixotropic substance.

8. The method according to claim 1, further comprising the step of supplying the droplet material with an additive that influences the capacity of the droplet material to refract microwave radiation.

9. The method according to claim 8, further comprising the step of supplying the material with an additive that influences the dielectric constant of the droplet material.

10. The method according to claim 9, wherein the additive that influences the dielectric constant of the material includes barium titanate or magnesium titanate.

11. The method according to claim 1, further comprising the step of disposing the droplet in a frame that influences the shape taken by the droplet in a liquid state.

12. The method according to claim 1, further comprising the step of solidifying the droplet by means of a curing process.

13. The method according to claim 1, wherein the material has a relative dielectric constant greater than ten.

14. The method according to claim 1, further comprising the step of arranging the droplet with the aid of a dispenser.

15. The method according to claim 1, further comprising the step of mounting at least one of the antenna elements on a carrier element.

16. The method according to claim 15, wherein the carrier element is a microwave chip.

17. The method according to claim 15, further comprising the step of enclosing the carrier element within the droplet.

18. A device for transmitting or receiving microwave radiation that comprises at least one antenna element for the microwave range, and at least one microwave lens disposed in the close proximity of at least one of the at least one antenna element, wherein at least one of the at least one microwave lens is comprised of a solidified droplet of material that refracts microwave radiation.

19. The device according to claim 18, wherein the droplet encapsulates at least one of the at least one antenna element.

20. The device according to claim 18, wherein the droplet material is a polymeric material.

21. The device according to claim 18, wherein the droplet material is a thermosetting resin.

22. The device according to claim 18, wherein the droplet material includes an additive that influences the ability of the material to refract microwave radiation.

23. The device according to claim 22, wherein the droplet material includes an additive that influences the dielectric constant of the material.

24. The device according to claim 18, wherein at least one of the at least one antenna element is mounted on a carrier element.

25. The device according to claim 24, wherein the droplet encapsulates the carrier element.

* * * * *